(12) United States Patent
Kao et al.

(10) Patent No.: US 12,368,105 B2
(45) Date of Patent: Jul. 22, 2025

(54) ELECTRONIC DEVICE HAVING A SILANE COUPLING AGENT IN AN INSULATING LAYER

(71) Applicant: InnoLux Corporation, Miao-Li County (TW)

(72) Inventors: Ker-Yih Kao, Miao-Li County (TW); Hung-I Tseng, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 510 days.

(21) Appl. No.: 17/736,067

(22) Filed: May 3, 2022

(65) Prior Publication Data

US 2023/0089751 A1   Mar. 23, 2023

(30) Foreign Application Priority Data

Sep. 17, 2021   (CN) .......................... 202111094921.5

(51) Int. Cl.
*H01L 23/538* (2006.01)
*H01L 21/48* (2006.01)

(52) U.S. Cl.
CPC ...... *H01L 23/5383* (2013.01); *H01L 21/4857* (2013.01); *H01L 23/5386* (2013.01)

(58) Field of Classification Search
CPC ............ H01L 21/4846; H01L 21/4857; H01L 21/486; H01L 2224/023; H01L 2224/0231; H01L 2224/0233
USPC ........................................................ 257/774
See application file for complete search history.

(56) References Cited

U.S. PATENT DOCUMENTS

| | | | |
|---|---|---|---|
| 7,205,660 B2 | 4/2007 | Park | |
| 11,004,838 B2 | 5/2021 | Chen | |
| 2006/0128142 A1 | 6/2006 | Whelan | |
| 2019/0051607 A1 | 2/2019 | Suk | |
| 2020/0105689 A1 | 4/2020 | Hwang | |
| 2021/0287937 A1* | 9/2021 | Shih | ..... H01L 21/7682 |

FOREIGN PATENT DOCUMENTS

| | | |
|---|---|---|
| EP | 1 691 414 A2 | 8/2006 |
| EP | 1 691 414 A3 | 11/2010 |

* cited by examiner

*Primary Examiner* — Hoai V Pham
(74) *Attorney, Agent, or Firm* — Winston Hsu (57) ABSTRACT

An electronic device includes a first metal layer, a first insulating layer, a second metal layer and a second insulating layer. The first insulating layer is disposed on the first metal layer, the second metal layer is disposed on the first insulating layer, and the second insulating layer is disposed between the second metal layer and the first insulating layer. The second metal layer is electrically connected to the first metal layer through a first opening of the first insulating layer and a second opening of the second insulating layer.

5 Claims, 12 Drawing Sheets

ELECTRONIC DEVICE HAVING A SILANE COUPLING AGENT IN AN INSULATING LAYER

BACKGROUND OF THE DISCLOSURE

1. Field of the Disclosure

The present disclosure relates to an electronic device and a manufacturing method thereof, and more particularly to an electronic device and a manufacturing method thereof that improves the adhesion between a metal layer and an insulating layer.

2. Description of the Prior Art

Recently, with electronic devices have become smaller and smaller and more components need to be integrated into the electronic devices, the design and quality of metal traces between the components will affect the reliability of the electronic devices. In the metal trace structure, the metal layer and the insulating layer have different material properties, so that the adhesion between the metal layer and the insulating layer is poor, thereby reducing the reliability of the electronic device. Therefore, how to improve the metal trace quality is an issue that needs further improvement.

SUMMARY OF THE DISCLOSURE

An embodiment of the present disclosure provides an electronic device, which includes a first metal layer, a first insulating layer, a second metal layer and a second insulating layer. The first insulating layer is disposed on the first metal layer, the second metal layer is disposed on the first insulating layer, and the second insulating layer is disposed between the second metal layer and the first insulating layer. The second metal layer is electrically connected to the first metal layer through a first opening of the first insulating layer and a second opening of the second insulating layer.

An embodiment of the present disclosure provides a manufacturing method of an electronic device including the following steps. A first metal layer is formed on a substrate. A first insulating layer is formed on the substrate and the first metal layer, where the first insulating layer includes a first opening, and the first opening exposes an upper surface of the first metal layer. A second insulating layer is formed on the first insulating layer, where the second insulating layer extends into the first opening, the second insulating layer includes a second opening, and the second opening is disposed in the first opening. A seed layer is formed on the second insulating layer, where the seed layer extends into the second opening. A second metal layer is formed on the seed layer, where the second metal layer is electrically connected to the first metal layer through the first opening of the first insulating layer and the second opening of the second insulating layer.

These and other objectives of the present disclosure will no doubt become obvious to those of ordinary skill in the art after reading the following detailed description of the embodiment that is illustrated in the various figures and drawings.

DETAILED DESCRIPTION

The contents of the present disclosure will be described in detail with reference to specific embodiments and drawings. It is noted that, for purposes of illustrative clarity and being easily understood by the readers, the following drawings may be simplified schematic diagrams of electronic devices or a portion of the electronic devices, and components therein may not be drawn to scale. The numbers and dimensions of the components in the drawings are just illustrative, and are not intended to limit the scope of the present disclosure.

Certain terms are used throughout the specification and the appended claims of the present disclosure to refer to specific components. Those skilled in the art should understand that electronic equipment manufacturers may refer to a component by different names, and this document does not intend to distinguish between components that differ in name but not function. In the following description and claims, the terms "comprise", "include" and "have" are used in an open-ended fashion, so they should be interpreted as "including but not limited to . . . ".

It should be understood that when a component or layer is referred to as being "on" or "disposed on" another component or layer, or "connected to" another component or layer, it may be directly on the another component or layer or directly connected to the another component or layer, or there may be an interposed component or layer between the two components or layers (indirect case). Conversely, when a component is referred to as being "directly on" another component or layer, "directly disposed on" another component or layer, or "directly connected to" another component or layer, there are no interposed components or layers between the two components or layers. In addition, the arrangement relationship between different components may be explained by the content of the drawings.

An electrical connection may be a direct connection or an indirect connection. When two elements are electrically connected, the electrical signals may be transmitted by direct contact, and there are no other elements presented between the two elements. When two elements are electrically connected, the electrical signals may be transmitted through the intermediate element bridging the two elements. The electrical connection may also be referred to as coupling.

In addition, it should be understood that although the terms "first", "second", "third", etc. may be used herein to describe various components, these components should not be limited by these terms. These terms may be used to distinguish different components. The same terms may not be used in the claims, and the components in the claims may be described by the terms "first", "second", "third", etc. according to the order of the components presented in the claims. Thus, a first component discussed below may be termed as a second component in the claims without departing from the present disclosure.

According to the embodiments of the present disclosure, the width, thickness, height or area of each component, or the distance or spacing between components may be measured by using an optical microscopy (OM), a scanning electron microscope (SEM), a film thickness profile measuring instrument (α-step), an ellipsometer, or other suitable methods. In detail, according to some embodiments, a scanning electron microscope may be used to obtain a cross-sectional structure image containing the components to be measured, and to measure the width, thickness, height or area of each component, or the distance or spacing between the components, and to obtain the volume of the component through appropriate methods (such as integration).

Here, the terms "about", "equal to", "equal" or "the same", "substantially" or "approximately" usually mean within 20% of a given value, or within 10%, 5%, 3%, 2%, 1% or 0.5% of the given value.

It should be understood that according to the following embodiments, features of different embodiments may be replaced, recombined or mixed to constitute other embodiments without departing from the spirit of the present disclosure.

The electronic devices of the present disclosure may include, for example, a package component, a display device, an antenna device, a touch display device, a curved display device, or a non-rectangular display device (free shaped display device), but not limited thereto. The electronic devices may be bendable or flexible electronic devices. The electronic devices may include, for example, a light-emitting diode (LED), liquid crystal, fluorescence, phosphor, other suitable display medium, or a combination thereof, but not limited thereto. The light-emitting diode may include, for example, an organic light-emitting diode (OLED), an inorganic light-emitting diode (LED), a mini light emitting diode (mini-LED), a micro light emitting diode (micro-LED) or quantum dots (QDs) light emitting diode (such as QLED, QDLED), other suitable materials, or any combination thereof, but not limited thereto. The display devices may include, for example, a tiled display device, but not limited thereto.

The antenna device may include, for example, a liquid crystal antenna, or other kinds of antenna, but not limited thereto. The antenna device may include, for example, a tiled antenna device, but not limited thereto. It should be noted that the electronic devices of the present disclosure may be any combination of the aforementioned devices, but not limited thereto. In addition, the appearance of the electronic devices may be rectangular, circular, polygonal, a shape with curved edges, or other suitable shapes. The electronic devices may have peripheral systems such as a driving system, a control system, a light source system, a shelf system, etc., to support a display device, an antenna device or a tiled device. The following electronic devices take a package component as an example, but not limited thereto.

A direction X and a direction Z are shown in the following drawings. An electronic device 10 of the present disclosure may for example be a package component, where the electronic device 10 may include a plurality of insulating layers and a plurality of metal layers, and these insulating layers and these metal layers may for example form a redistribution layer (RDL) in the package component, but not limited thereto. In a schematic cross-sectional view (for example, FIG. 6 of the present disclosure), the electronic device 10 may be formed of insulating layers and conductive layers stacked alternately one by one along the direction Z.

The direction Z may be the stacking direction of the insulating layers and the metal layers in the electronic device 10, but not limited thereto. The direction X may be, for example, the extending direction of the insulating layer, but not limited thereto. The direction Z may be perpendicular to the direction X. The direction Z may also be referred to as a vertical projection direction or a top-view direction. The spatial relationship of the structure may be described according to the direction X and the direction Z in the following drawings.

Figure 1:
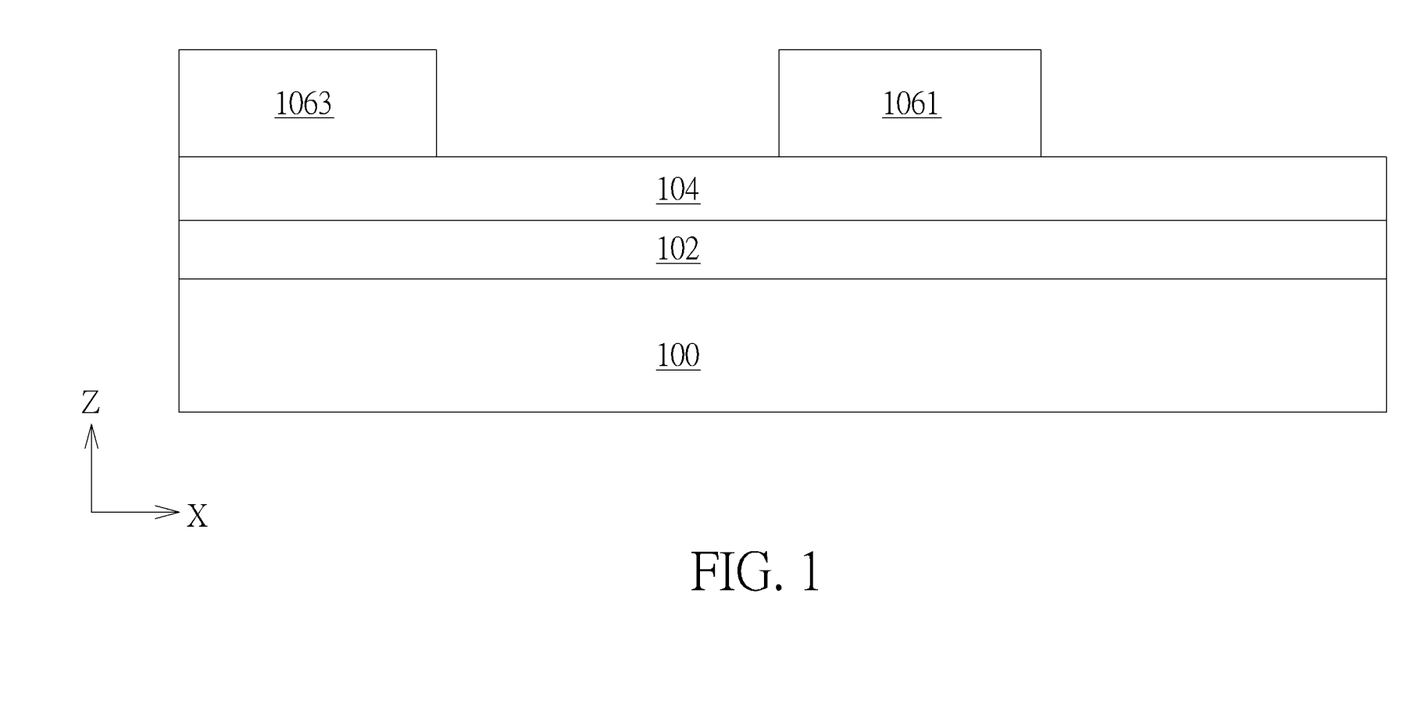
FIG. 1, FIG. 2, FIG. 3, FIG. 4, FIG. 5 and FIG. 6 are schematic cross-sectional diagrams illustrating a manufacturing method of an electronic device according to a first embodiment of the present disclosure.
Figure 8:
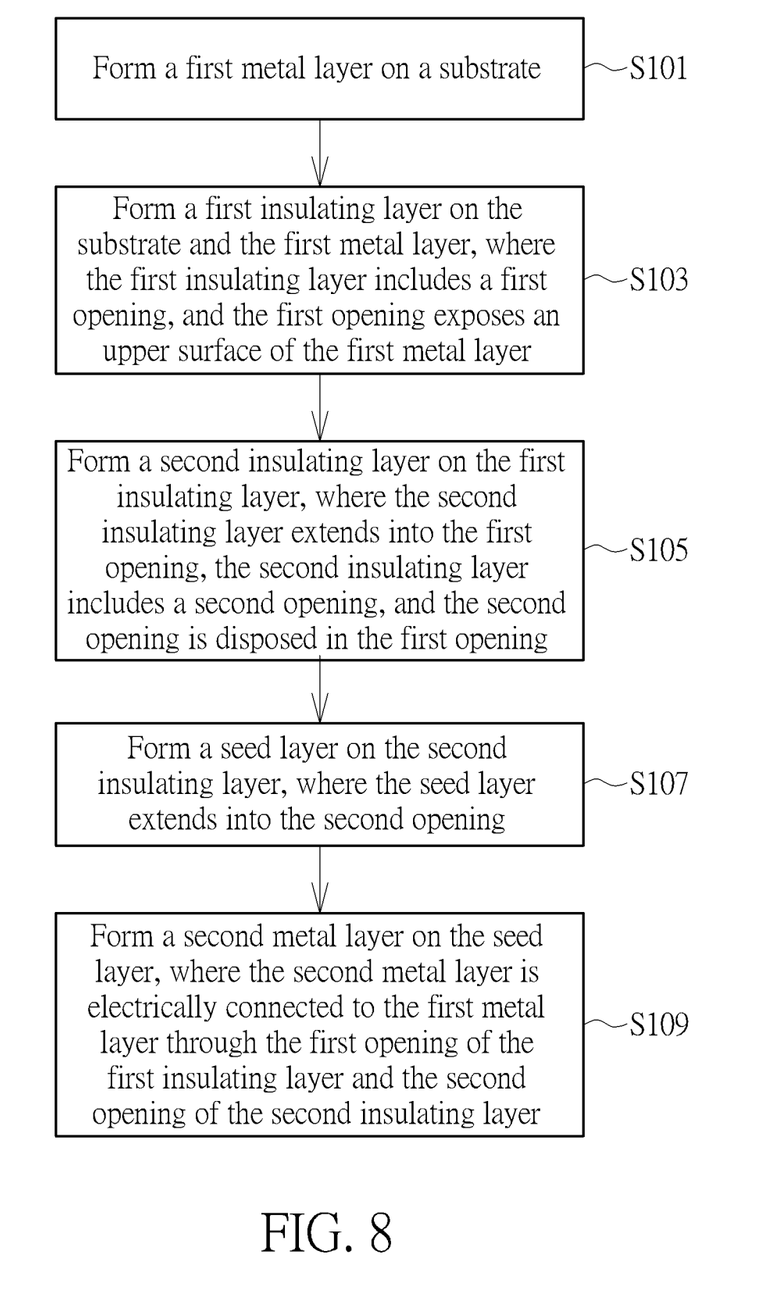
FIG. 8 is a flow chart of steps of the manufacturing method of the electronic device according to the first embodiment of the present disclosure.

Please refer to FIG. 1 to FIG. 8, FIG. 1 to FIG. 6 are schematic cross-sectional diagrams illustrating a manufacturing method of an electronic device according to a first embodiment of the present disclosure, and FIG. 8 is a flow chart of steps of the manufacturing method of the electronic device according to the first embodiment of the present disclosure. As shown in FIG. 1 and FIG. 8, a step S101 may be performed to form a first metal layer (such as a metal layer 1061) on a substrate 100. Firstly, the substrate 100 may be provided, and the material of the substrate 100 may include glass, quartz, sapphire, polymers (such as polyimide (PI), polyethylene terephthalate (PET)) and/or other suitable materials to be used as a flexible substrate or a rigid substrate, but not limited thereto.

Next, a release layer 102 may be formed on the substrate 100, and a seed layer 104 may be formed on the release layer 102. For example, the release layer 102 may be fully formed on the substrate 100, and the seed layer 104 may be fully formed on the release layer 102, but not limited thereto. In some embodiments, the material of the release layer 102 may include silicon oxide ($SiO_x$), silicon nitride ($SiN_x$), silicon oxynitride ($SiO_xN_y$), polymers (such as resin, epoxy resin, acrylic acid, polyimide, polyethylene terephthalate (PET)) or other suitable materials, but not limited thereto. In some embodiments, the material of the seed layer 104 (or the seed layers mentioned below) may include copper, titanium, aluminum, nickel, molybdenum, a combination thereof, or other suitable metal materials, but not limited thereto. For example, the seed layer 104 (or the seed layers mentioned below) may be formed by electroplating or other suitable processes, but not limited thereto.

Next, a metal layer 1061 (or may be referred to as a first metal layer) may be formed on the seed layer 104. As shown in FIG. 1, a metal layer 1063 may also be formed together with the metal layer 1061, but not limited thereto. In some embodiments, the metal layer 1063 and the metal layer 1061 may be formed separately, but not limited thereto. The metal layer 1061 and the metal layer 1063 may be a patterned metal layer. In some embodiments, a metal layer may be formed over the entire surface of the seed layer 104, and the metal layer (or the metal layers mentioned below) may be formed by electroplating, physical vapor deposition (PVD), atomic layer deposition (ALD), metal organic chemical vapor deposition (MOCVD) or other suitable processes, but not limited thereto. Then, the metal layer 1061 and the metal layer 1063 may be formed by photolithography and etching processes, or the metal layer 1061 and the metal layer 1063 may be formed by removing unnecessary metal portions through laser, but not limited thereto. In some embodiments, the metal layer 1061 and the metal layer 1063 may be formed by a screen printing process, but not limited thereto. In some embodiments, the material of the metal layer 1061 and the metal layer 1063 (or the metal layers mentioned below) may include copper (Cu), titanium (Ti), aluminum (Al), nickel (Ni), molybdenum (Mo), a combination thereof, an alloy thereof, a combination of alloys of the aforementioned metals, or other suitable metal materials, but not limited thereto.

Figure 2:
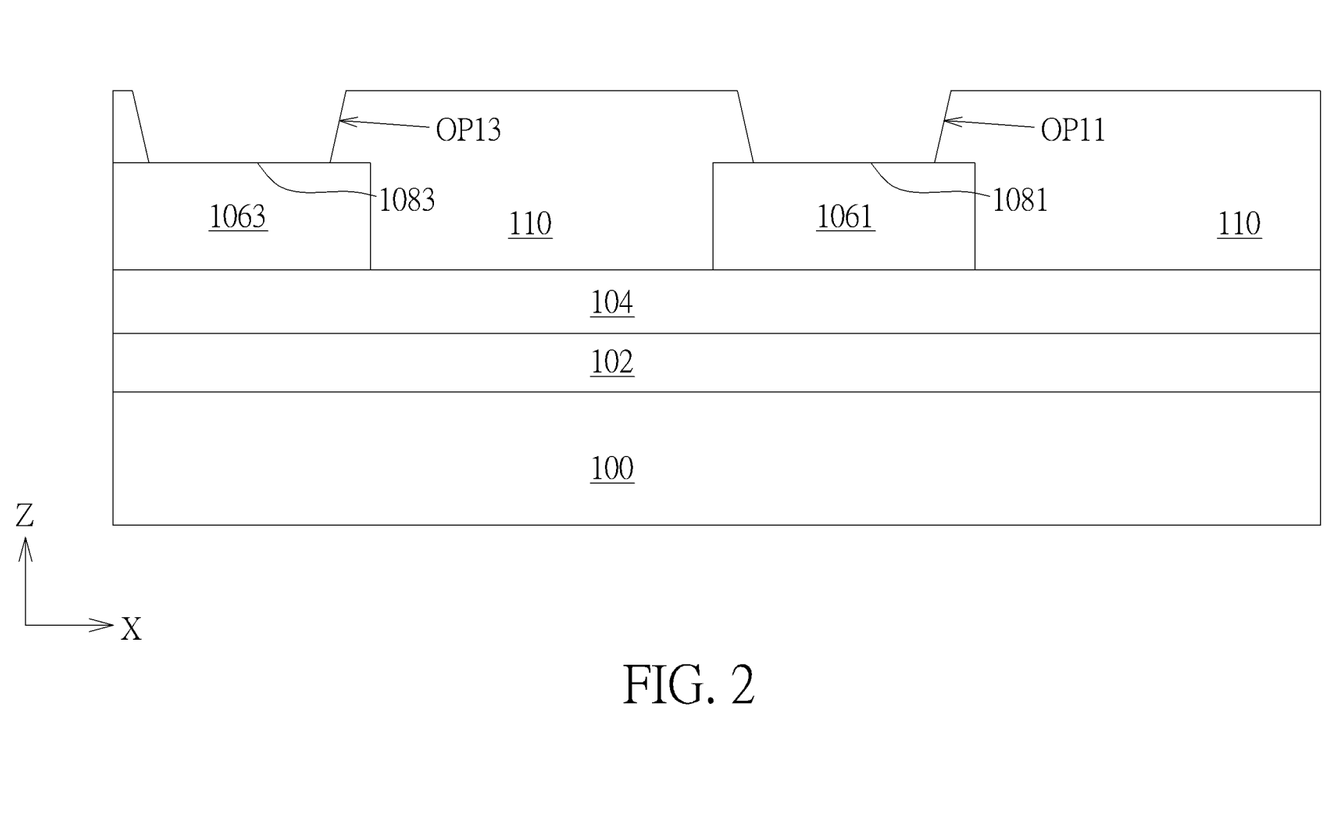

As shown in FIG. 2 and FIG. 8, then a step S103 may be performed to form an insulating layer 110 (or may be referred to as a first insulating layer) on the substrate 100 and the first metal layer (such as the metal layer 1061), where the insulating layer 110 includes a first opening (such as an opening OP11), and the first opening exposes an upper surface (such as an upper surface 1081) of the first metal layer. The material of the insulating layer 110 (or the insulating layers mentioned below) may include organic or inorganic insulating materials, but not limited thereto. In some embodiments, the material of the insulating layer 110 (or the insulating layers mentioned below) may include an organic insulating material, such as polyimide, but not limited thereto. In some embodiments, the material of the insulating layer 110 (or the insulating layers mentioned below) may include an inorganic insulating material, such as silicon oxide (SiO$_x$), silicon nitride (SiN$_x$) or silicon oxynitride (SiO$_x$N$_y$), but not limited thereto.

In some embodiments, an unpatterned insulating layer may be fully formed on the seed layer 104, the metal layer 1061 and the metal layer 1063, and the unpatterned insulating layer may be formed by a suitable coating process, laminating process, physical vapor deposition (PVD), atomic layer deposition (ALD) or other suitable thin film deposition processes, but not limited thereto. Next, an opening OP11 and an opening OP13 may be formed by photolithography and etching processes, but not limited thereto. The opening OP11 may expose a portion of the upper surface 1081 of the metal layer 1061, and the opening OP13 may expose a portion of an upper surface 1083 of the metal layer 1063.

Figure 3:
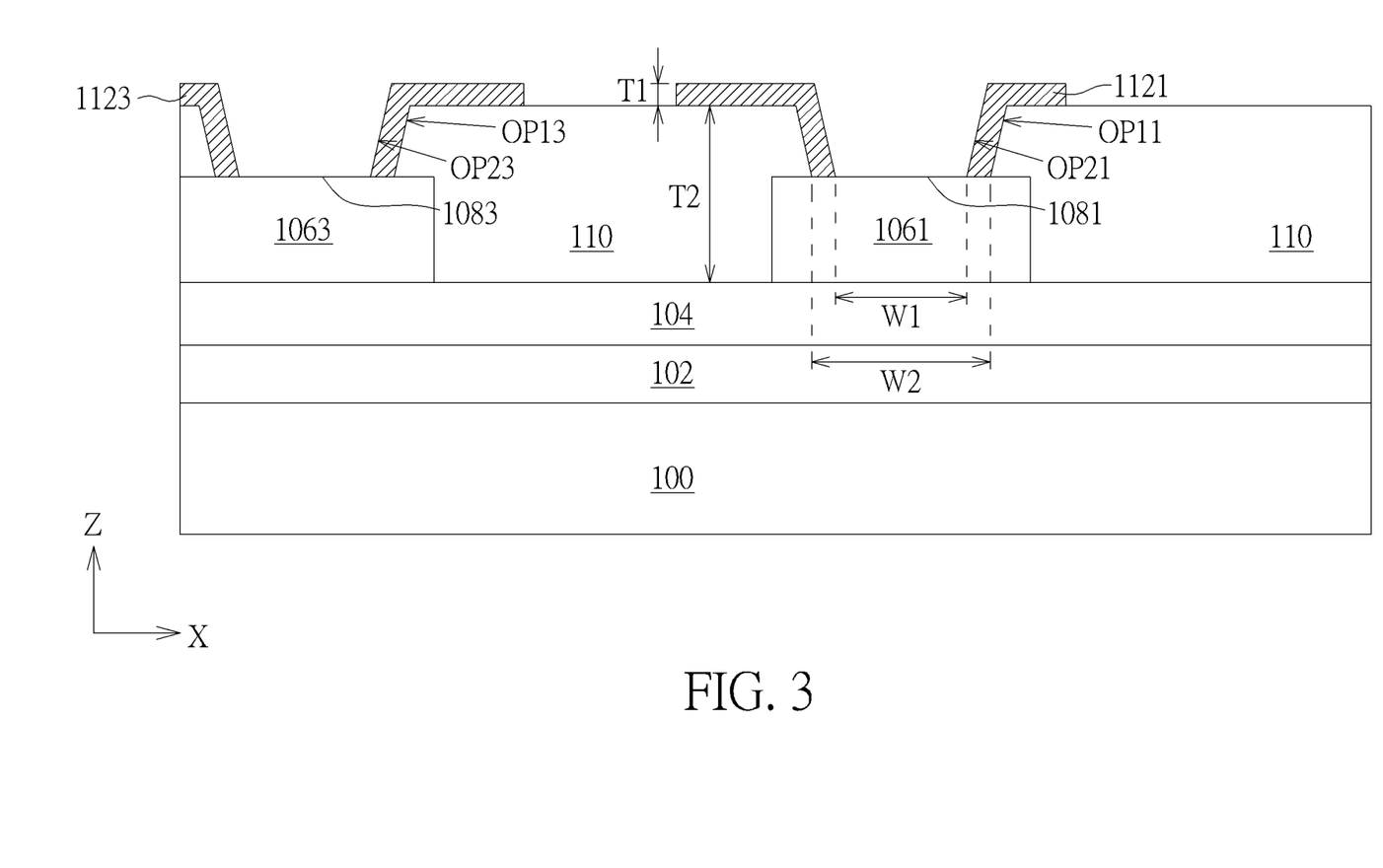

As shown in FIG. 3 and FIG. 8, then a step S105 may be performed to form an insulating layer (such as an insulating layer 1121, or may be referred to as a second insulating layer) on the insulating layer 110, where the insulating layer extends into the first opening (such as the opening OP11), the insulating layer includes a second opening (such as an opening OP21), and the second opening is disposed in the first opening. As shown in FIG. 3, an insulating layer 1123 may also be formed together with the insulating layer 1121, but not limited thereto. The insulating layer 1121 and the insulating layer 1123 may be a patterned insulating layer.

In some embodiments, an unpatterned insulating layer may be fully formed on the insulating layer 110, and the unpatterned insulating layer may be formed by slit coating, spin coating, thermal vapor deposition or other suitable thin film growth processes, but not limited thereto. The insulating layer 1121 and the insulating layer 1123 may be insulating layers of a single-layered material or a composite material. The insulating layer 1121 and the insulating layer 1123 may be formed together on the insulating layer 110, i.e., the unpatterned insulating layer fully formed on the insulating layer 110 is patterned by such as photolithography and etching processes to form the insulating layer 1121 and the insulating layer 1123, or the insulating layer 1121 and the insulating layer 1123 may be formed by removing unnecessary portions through laser, but not limited thereto. In some embodiments, the insulating layer 1121 and the insulating layer 1123 may be formed by a screen printing process, but not limited thereto. In some embodiments, the insulating layer 1121 and the insulating layer 1123 may be formed separately, but not limited thereto. In addition, the insulating layer 1121 and the insulating layer 1123 may be separated from each other without being in contact.

The insulating layer 1121 may extend into the opening OP11, and the insulating layer 1121 may include the opening OP21. The insulating layer 1123 may extend into the opening OP13, and the insulating layer 1123 may include an opening OP23. The opening OP21 is disposed in the opening OP11, and the opening OP23 is disposed in the opening OP13. The opening OP21 may expose a portion of the upper surface 1081 of the metal layer 1061, and the opening OP23 may expose a portion of the upper surface 1083 of the metal layer 1063.

The opening OP21 of the insulating layer 1121 has a width W1, the opening OP11 of the insulating layer 110 has a width W2, and the width W1 may be different from the width W2. As shown in FIG. 3, the width W1 may be smaller than the width W2. In some embodiments, the ratio (W1/W2) of the width W1 of the opening OP21 of the insulating layer 1121 to the width W2 of the opening OP11 of the insulating layer 110 may be greater than or equal to 0.5 and less than 1. The opening OP23 and the opening OP13 may also have the same width ratio. For example, the width of the opening may be obtained by measuring the width of the bottom of the opening, and the bottom of the opening may expose the upper surface of the underlying layer.

Figure 11:
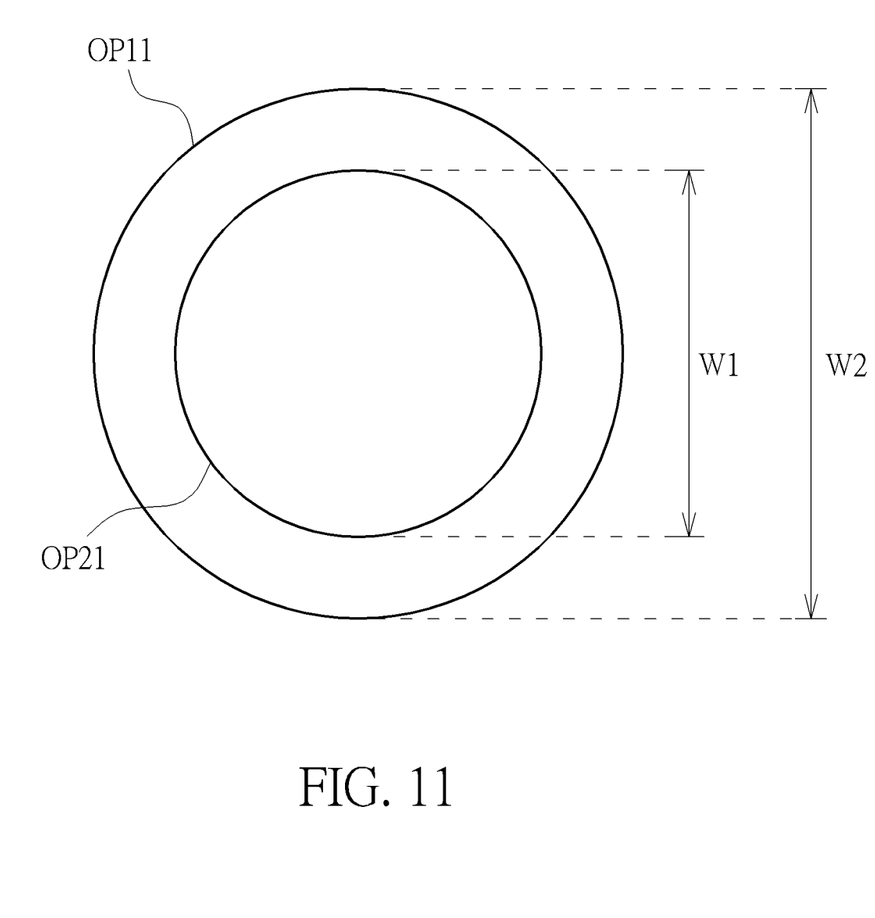
FIG. 11 is a schematic top view of an opening of an insulating layer according to an embodiment of the present disclosure.

In addition, please refer to FIG. 11, which is a schematic top view of the opening of the insulating layer. As shown in FIG. 11, the area of the opening OP21 of the insulating layer 1121 may be different from the area of the opening OP11 of the insulating layer 110. For example, the area of the opening OP21 of the insulating layer 1121 may be smaller than the area of the opening OP11 of the insulating layer 110. In some embodiments, the ratio of the area of the opening OP21 of the insulating layer 1121 to the area of the opening OP11 of the insulating layer 110 may be greater than or equal to 0.05 and less than 1. The opening OP23 and the opening OP13 may also have the same area ratio. For example, the area of the opening may be obtained by measuring the area of the bottom of the opening. Furthermore, the shape of the opening as shown in FIG. 11 is merely an example, and the opening may have any suitable shape.

The materials of the insulating layer 1121 and the insulating layer 1123 (or the insulating layers mentioned below) may include materials capable of forming a silicon bond with the material of an adjacent layer, but not limited thereto. For example, the materials of the insulating layer 1121 and the insulating layer 1123 (or the insulating layers mentioned below) may include a silane coupling agent, epoxy resin or other suitable organic materials, but not limited thereto. In some embodiments, a thickness T1 of the insulating layer 1121 and the insulating layer 1123 and a thickness T2 of the insulating layer 110 are different. As shown in FIG. 3, the thickness T1 of the insulating layer 1121 and the insulating layer 1123 may be smaller than the thickness T2 of the insulating layer 110, but not limited thereto. For example, the thickness T2 of the insulating layer 110 may be measured along the direction Z, and the thickness T1 of a portion of the insulating layer 1121 (or the insulating layer 1123) located on the insulating layer 110 may be measured along the direction Z.

Figure 4:
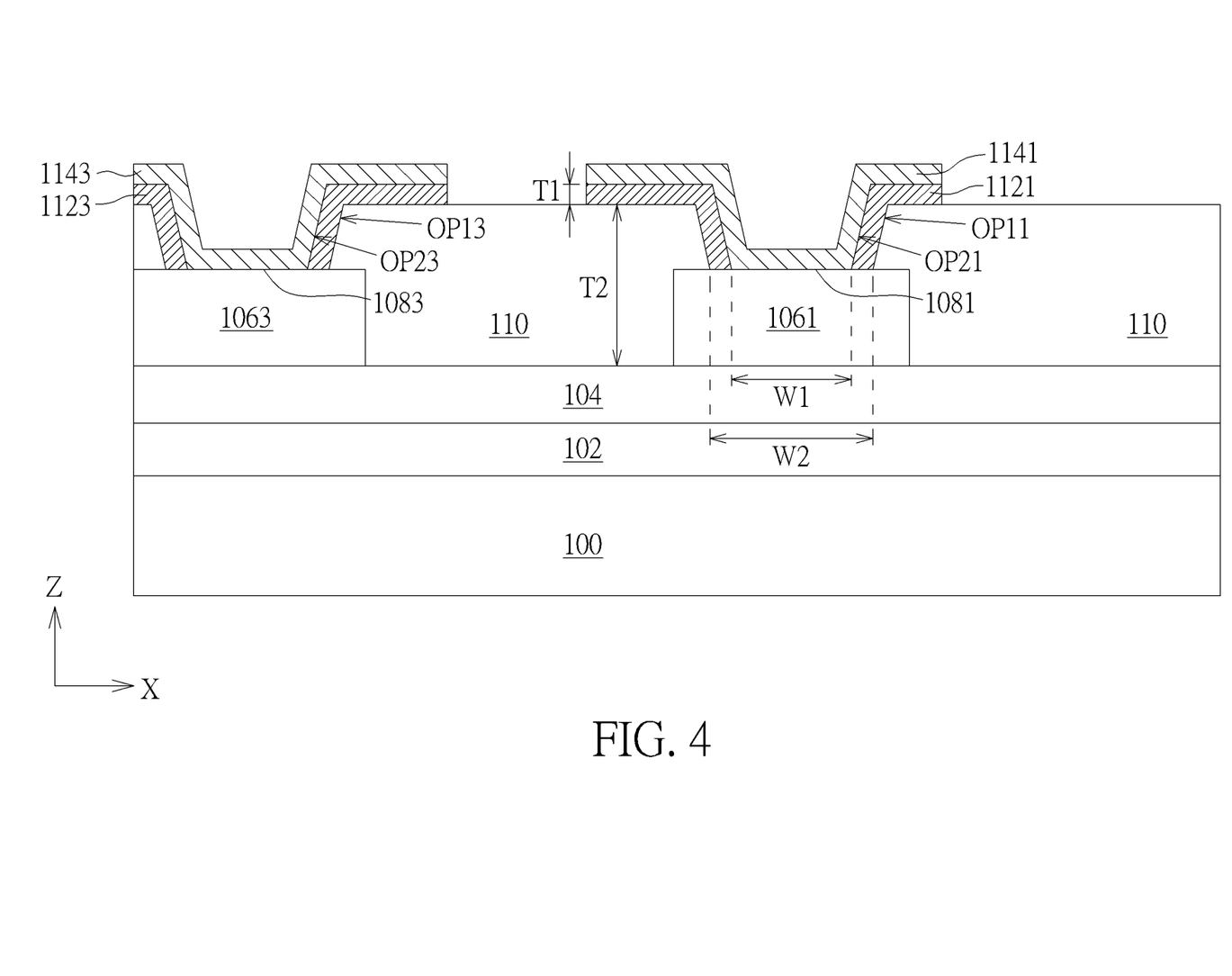

As shown in FIG. 4 and FIG. 8, then a step S107 may be performed to form a seed layer (such as a seed layer 1141)

on the insulating layer (such as the insulating layer 1121), where the seed layer extends into the second opening (such as the opening OP21). As shown in FIG. 4, a seed layer 1143 may also be formed together with the seed layer 1141, i.e., the seed layer 1141 and the seed layer 1143 may be a patterned seed layer, but not limited thereto. In some embodiments, the seed layer 1143 and the seed layer 1141 may be formed separately, but not limited thereto.

In some embodiments, an unpatterned seed layer may be fully formed on the insulating layer 110, the insulating layer 1121 and the insulating layer 1123 by sputtering, thin film deposition or other suitable processes. Then, the seed layer 1141 and the seed layer 1143 may be formed by photolithography and etching processes, or the seed layer 1141 and the seed layer 1143 may be formed by removing unnecessary portions through laser, but not limited thereto. In some embodiments, the seed layer 1141 and the seed layer 1143 may be formed by a screen printing process, but not limited thereto.

The seed layer 1141 may be formed on the insulating layer 1121 and extend into the opening OP21, and the seed layer 1141 may be in contact with a portion of the upper surface 1081 of the metal layer 1061 exposed by the opening OP21. The seed layer 1143 may be formed on the insulating layer 1123 and extend into the opening OP23, and the seed layer 1143 may be in contact with a portion of the upper surface 1083 of the metal layer 1063 exposed by the opening OP23. Although the seed layer 1141 and the seed layer 1143 may be separated from each other in FIG. 4, the seed layer 1141 and the seed layer 1143 may be electrically connected with each other or electrically isolated from each other. In addition, the insulating layer 1121 may be completely covered by the seed layer 1141, and the insulating layer 1123 may be completely covered by the seed layer 1143, but not limited thereto.

Figure 5:
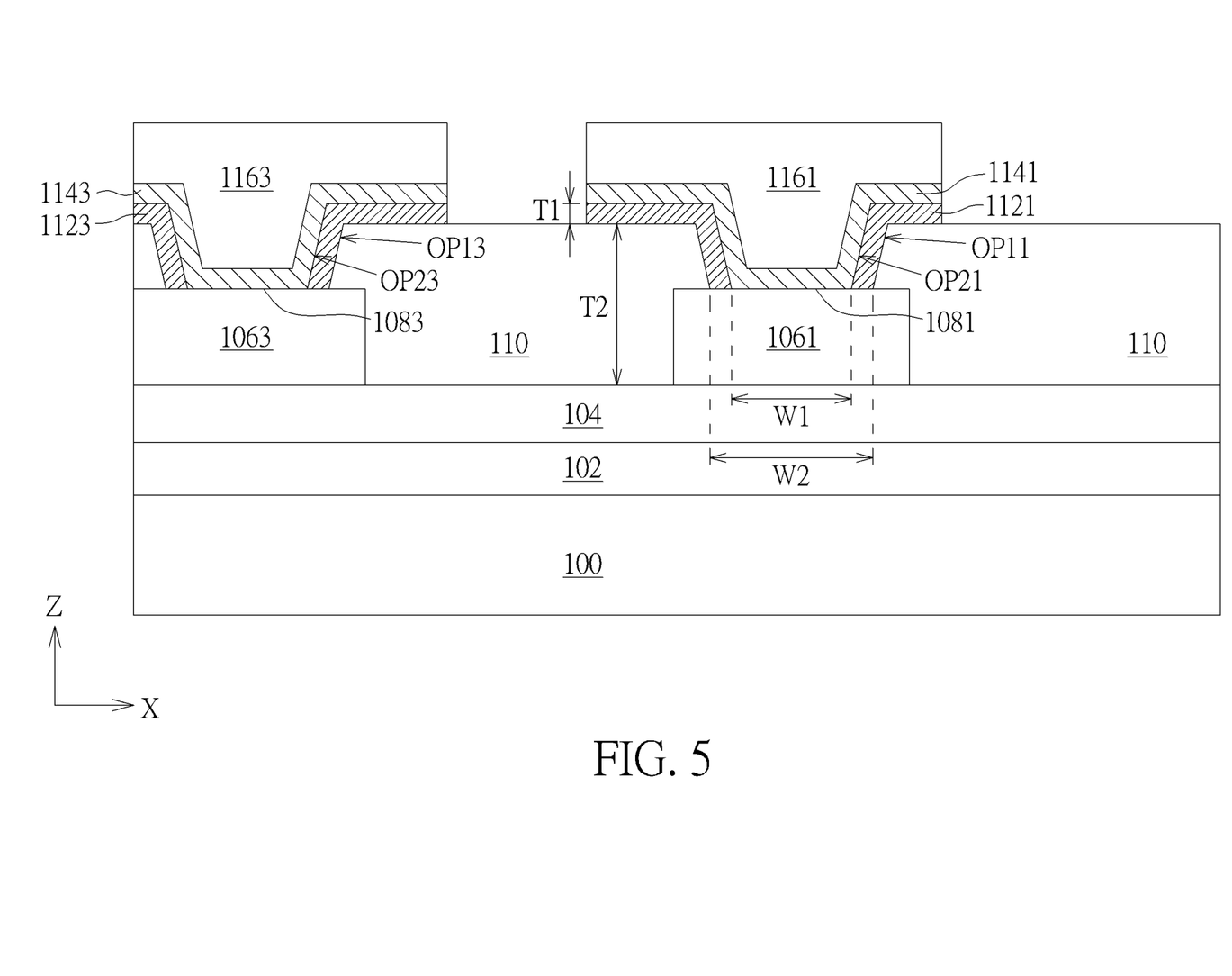

As shown in FIG. 5 and FIG. 8, then a step S109 may be performed to form a second metal layer (such as a metal layer 1161) on the seed layer (such as the seed layer 1141), where the second metal layer is electrically connected to the first metal layer (such as the metal layer 1061) through the first opening (such as the opening OP11) of the insulating layer 110 and the second opening (such as the opening OP21) of the insulating layer (such as the insulating layer 1121). The metal layer 1161 and a metal layer 1163 may be a patterned metal layer. For example, the metal layer 1161 may be formed on the seed layer 1141 and the metal layer 1163 may be formed on the seed layer 1143 by electroplating or other suitable processes, but not limited thereto.

The metal layer 1161 may be electrically connected to the metal layer 1061 through the opening OP11 of the insulating layer 110, the opening OP21 of the insulating layer 1121, and the seed layer 1141 in the opening OP21. The metal layer 1163 may be electrically connected to the metal layer 1063 through the opening OP13 of the insulating layer 110, the opening OP23 of the insulating layer 1123, and the seed layer 1143 in the opening OP23. For example, the metal layer 1061, the insulating layer 110, the insulating layer 1121, the seed layer 1141 and the metal layer 1161 may constitute a portion of a redistribution layer (such as the electronic device 10 of FIG. 6), but not limited thereto. The metal layer 1061 and the metal layer 1161 may be connection elements in the redistribution layer, but not limited thereto.

The metal layer (such as an inorganic material) and the insulating layer (such as an organic material) have different material properties, so that the adhesion between the metal layer and the insulating layer may be poor, thereby reducing the reliability of the electronic device. In the current technology, the insulating layer may be processed by a surface treatment to obtain a good adhesion between the insulating layer and the metal layer. However, the surface treatment requires using plasma in a vacuum environment, and the vacuum equipment is complicated and expensive.

In the present disclosure, the insulating layer 1121 may be formed between the insulating layer 110 and the seed layer 1141, where the insulating layer 1121 includes a silane coupling agent that increases the adhesion between the seed layer 1141 (or the metal layer 1161) and the insulating layer 110, so that the plasma surface treatment and the vacuum equipment may not be required. In this way, the reliability of the electronic device can be improved, and the cost thereof can also be saved.

Figure 6:
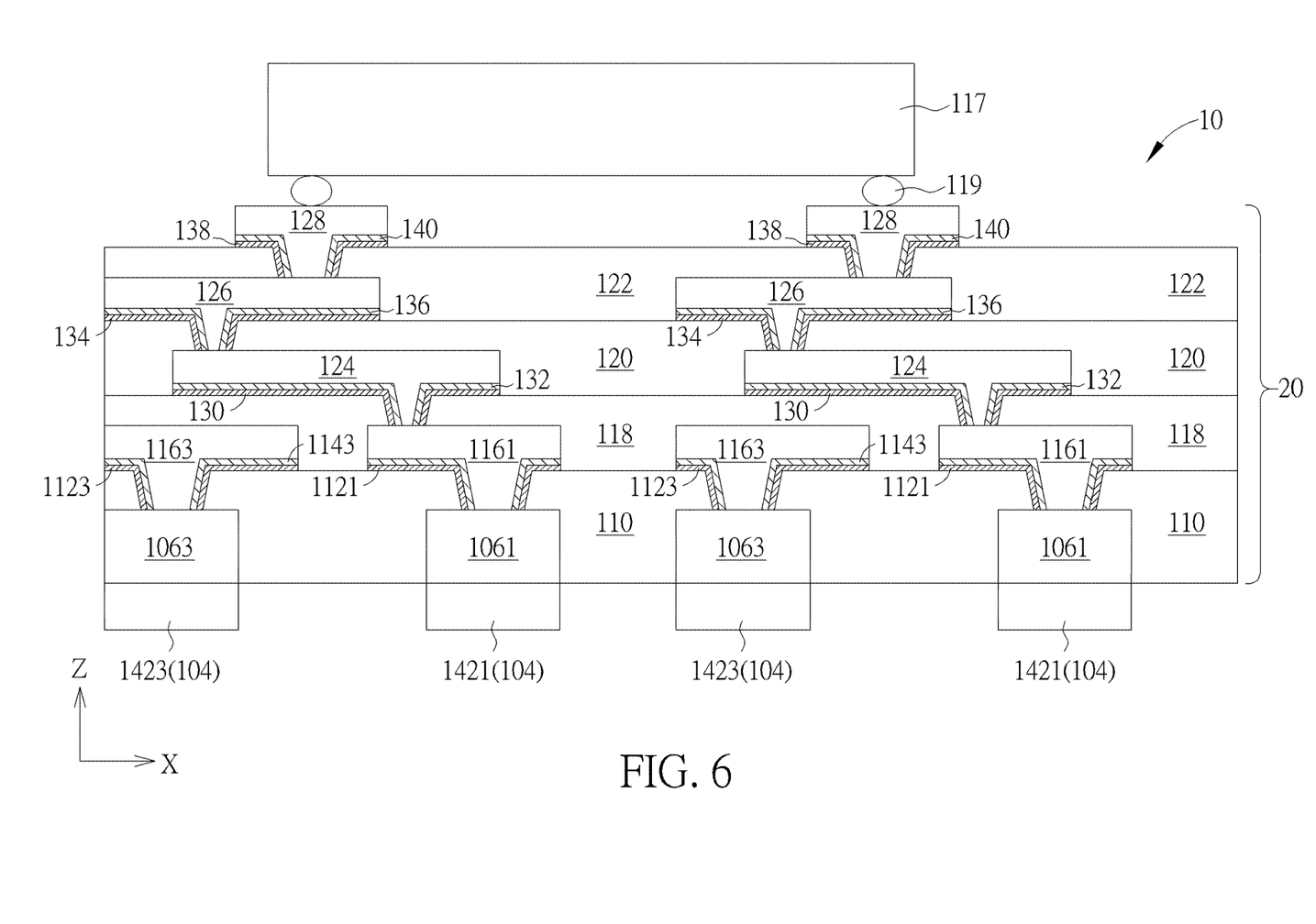

Next, the aforementioned steps may be repeated to form a stacked structure 20 of multiple metal layers and multiple insulating layers on the metal layer 1161 and the metal layer 1163. As shown in FIG. 6, a plurality of metal layers 1161 and a plurality of metal layers 1163 may be formed on the substrate 100, and multiple insulating layers 118, 120 and 122 and multiple metal layers 124, 126 and 128 may be formed on the metal layers 1161 and the metal layers 1163, but not limited thereto. The insulating layer 118 may be disposed between the metal layer 124 and the metal layer 1161 (or the metal layer 1163), and the metal layer 124 may be electrically connected to the metal layer 1161. The insulating layer 120 may be disposed between the metal layer 126 and the metal layer 124, and the metal layer 126 may be electrically connected to the metal layer 124. The insulating layer 122 may be disposed between the metal layer 128 and the metal layer 126, and the metal layer 128 may be electrically connected to the metal layer 126. The material of the insulating layers 118, 120 and 122 may be the same as the material of the insulating layer 110, but not limited thereto.

In addition, an insulating layer 130 and a seed layer 132 may be formed between the metal layer 124 and the insulating layer 118, an insulating layer 134 and a seed layer 136 may be formed between the metal layer 126 and the insulating layer 120, and an insulating layer 138 and a seed layer 140 may be formed between the metal layer 128 and the insulating layer 122. The material of the insulating layers 130, 134 and 138 may be the same as the material of the insulating layer 1121, but not limited thereto.

Next, the substrate 100 may be removed by removing the release layer 102 in FIG. 1, and a patterning process may be performed on the seed layer 104 in FIG. 1 to form one or more metal layers 1421 and one or more metal layers 1423. The pattern of the metal layer 1421 may be substantially the same as the pattern of the metal layer 1061, and the pattern of the metal layer 1423 may be substantially the same as the pattern of the metal layer 1063, but not limited thereto.

In addition, the electronic device 10 of some embodiments may be a redistribution layer first (RDL first) package structure. As shown in FIG. 6, a chip 117 may be bonded to the aforementioned stacked structure 20 of metal layers and insulating layers. For example, contacts on the chip 117 may be bonded to the metal layer 128 through bonding pads 119, but not limited thereto.

Figure 7:
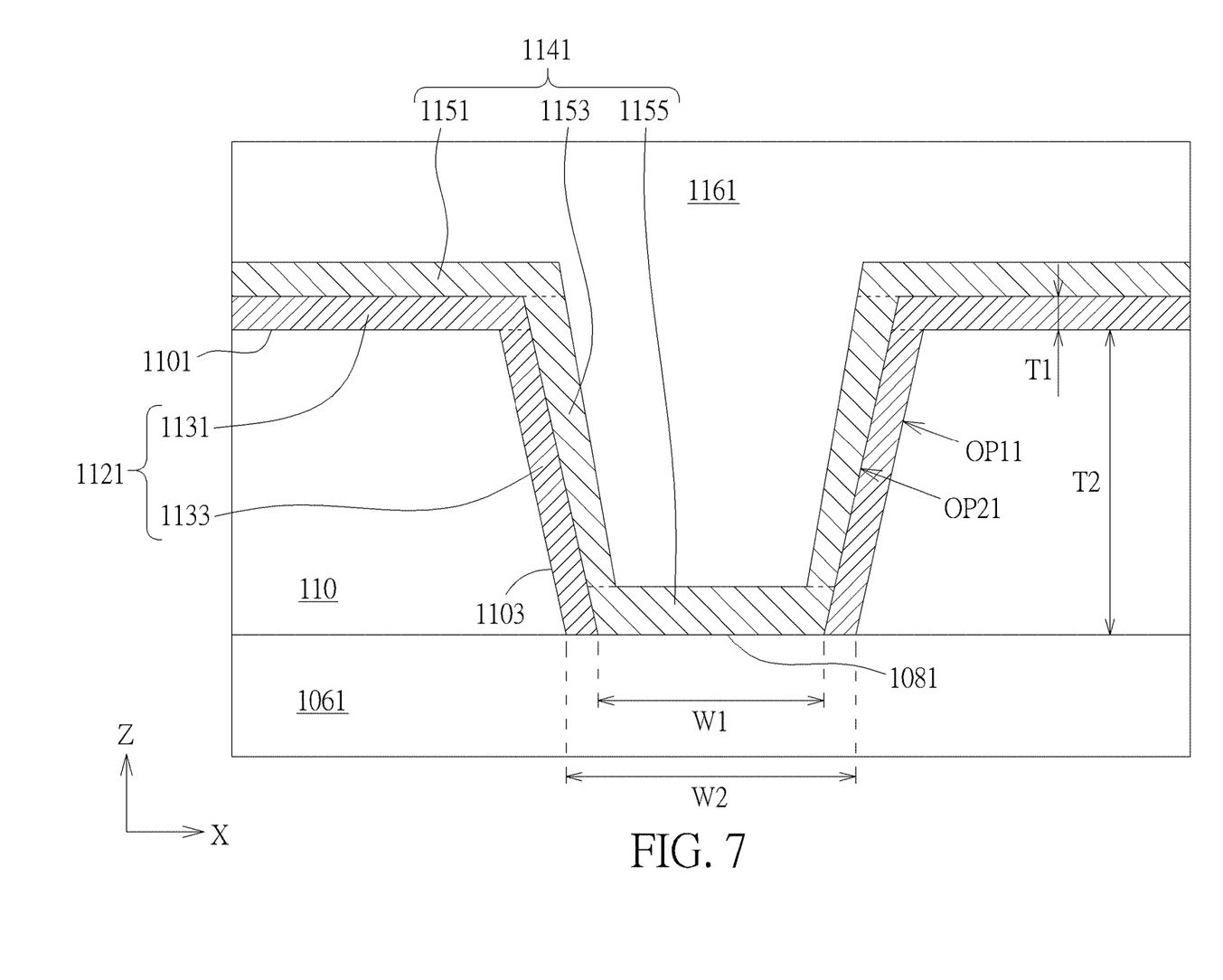
FIG. 7 is a partially enlarged schematic cross-sectional diagram of an electronic device according to the first embodiment of the present disclosure.

Please refer to FIG. 7, which is a partially enlarged schematic diagram of the electronic device according to the first embodiment of the present disclosure. As the aforementioned descriptions (see FIG. 6 and FIG. 7), the present disclosure provides the electronic device 10, which includes the metal layer 1061, the insulating layer 110, the metal layer 1161 and the insulating layer 1121. The insulating layer 110 may be disposed on the metal layer 1061, the metal layer 1161 may be disposed on the insulating layer 110, and the insulating layer 1121 may be disposed between the metal layer 1161 and the insulating layer 110. The metal layer 1161 may be electrically connected to the metal layer 1061 through the opening OP11 of the insulating layer 110 and the opening OP21 of the insulating layer 1121.

As shown in FIG. 7, the insulating layer 110 may include an upper surface 1101 and a side surface 1103, and the side surface 1103 may be connected with the upper surface 1101. The upper surface 1101 may extend substantially along the direction X, the extension direction of the side surface 1103 is different from the extension direction of the upper surface 1101, and the side surface 1103 may be a inclined surface.

The insulating layer 1121 may include a portion 1131 and a portion 1133, and the portion 1133 may be connected with the portion 1131. The portion 1131 of the insulating layer 1121 may be disposed on the upper surface 1101 of the insulating layer 110, and the portion 1131 of the insulating layer 1121 can extend substantially along the direction X, i.e., the extending direction of the portion 1131 of the insulating layer 1121 may be the same as the extending direction of the upper surface 1101 of the insulating layer 110. The extending direction of the portion 1133 of the insulating layer 1121 may be different from the extending direction of the portion 1131 of the insulating layer 1121, the extending direction of the portion 1133 of the insulating layer 1121 may be the same as the extending direction of the side surface 1103 of the insulating layer 110, and the portion 1133 of the insulating layer 1121 may be disposed on the side surface 1103 of the insulating layer 110.

The seed layer 1141 may include a portion 1151, a portion 1153, and a portion 1155, and the portion 1153 may be connected with the portion 1151 and the portion 1155. One end of the portion 1153 may be connected to the portion 1151, and another end of the portion 1153 may be connected to the portion 1155. The portion 1151 of the seed layer 1141 may be disposed on the portion 1131 of the insulating layer 1121 and may completely cover the portion 1131 of the insulating layer 1121, but not limited thereto. The portion 1153 of the seed layer 1141 may be disposed on the portion 1133 of the insulating layer 1121 and may completely cover the portion 1133 of the insulating layer 1121, but not limited thereto. The portion 1155 of the seed layer 1141 may be disposed on a portion of the upper surface 1081 of the metal layer 1061 within the opening OP21. The portion 1151 and the portion 1155 may extend substantially along the direction X, i.e., the extending direction of the portion 1151 and the portion 1155 may be the same as the extending direction of the upper surface 1101 of the insulating layer 110. The extending direction of the portion 1153 may be different from the extending direction of the portion 1151 or the portion 1155, and the extending direction of the portion 1153 may be the same as the extending direction of the side surface 1103 of the insulating layer 110.

In addition, the electronic device 10 (as shown in FIG. 6 and FIG. 7) may include a package structure, and may include a redistribution layer (such as the stack structure 20) in the package structure, but not limited thereto. The redistribution layer (such as the electronic device 10 or the stacked structure 20 therein) may include at least the metal layer 1061, the insulating layer 110, the insulating layer 1121 and the metal layer 1161. In addition, the metal layers in the electronic device 10 may be, for example, connection elements in the redistribution layer, but not limited thereto.

The electronic devices and the manufacturing methods thereof of the present disclosure are not limited to the aforementioned embodiments. The following will continue to disclose other embodiments of the present disclosure. However, in order to simplify the description and highlight the differences between the embodiments, the same reference numerals are used to denote the same elements hereinafter, and the repeated portions will not be described again.

Figure 9:
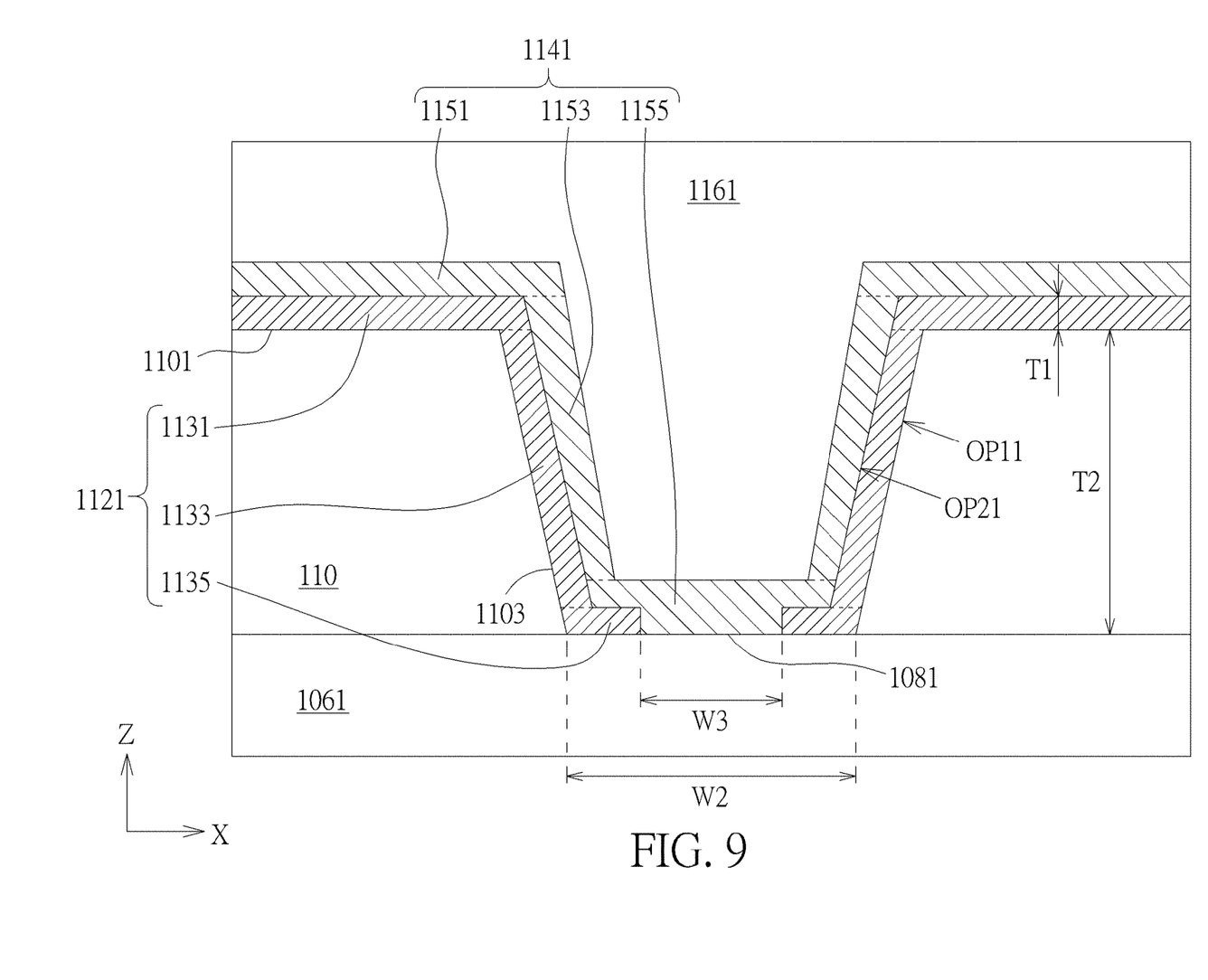
FIG. 9 is a partially enlarged schematic cross-sectional diagram of an electronic device according to a second embodiment of the present disclosure.

Please refer to FIG. 9, which is a partially enlarged schematic cross-sectional diagram of an electronic device according to a second embodiment of the present disclosure. The difference between this embodiment and the first embodiment (as shown in FIG. 7) is that the insulating layer 1121 may further include a portion 1135, and the portion 1133 may be connected with the portion 1131 and the portion 1135. One end of the portion 1133 may be connected to the portion 1131, and another end of the portion 1133 may be connected to the portion 1135. The portion 1131 and the portion 1135 may extend substantially along the direction X, i.e., the extending direction of the portion 1131 and the portion 1135 may be the same as the extending direction of the upper surface 1101 of the insulating layer 110. The extending direction of the portion 1133 may be different from the extending direction of the portion 1131 or the portion 1135, and the extending direction of the portion 1133 may be the same as the extending direction of the side surface 1103 of the insulating layer 110.

The portion 1135 of the insulating layer 1121 may be disposed on a portion of the upper surface 1081 of the metal layer 1061 within the opening OP11, and the portion 1135 may extend in the direction X. Furthermore, the portion 1135 may be covered by the portion 1153 and/or the portion 1155 of the seed layer 1141, and at least a portion of the insulating layer 1121 (such as the portion 1135) may be overlapped with the metal layer 1061 within the opening OP11.

Since the insulating layer 1121 may further include the portion 1135, the width of the opening OP21 may be further reduced. The opening OP21 of this embodiment (as shown in FIG. 9) has a width W3, and the width W3 is smaller than the width W1 of the opening OP21 of the first embodiment (as shown in FIG. 7). In addition, the area of the opening OP21 of this embodiment may also be smaller than the area of the opening OP21 of the first embodiment. For example, when the shape of the opening is circular, the ratio (W3/W2) of the width W3 of the opening OP21 of the insulating layer 1121 to the width W2 of the opening OP11 of the insulating layer 110 may be greater than or equal to 0.5 and less than 1. The ratio of the area of the opening OP21 to the area of the opening OP11 may be greater than or equal to 0.05 and less than 1. The shape of the opening may optionally be other suitable shapes, but not limited thereto.

Figure 10:
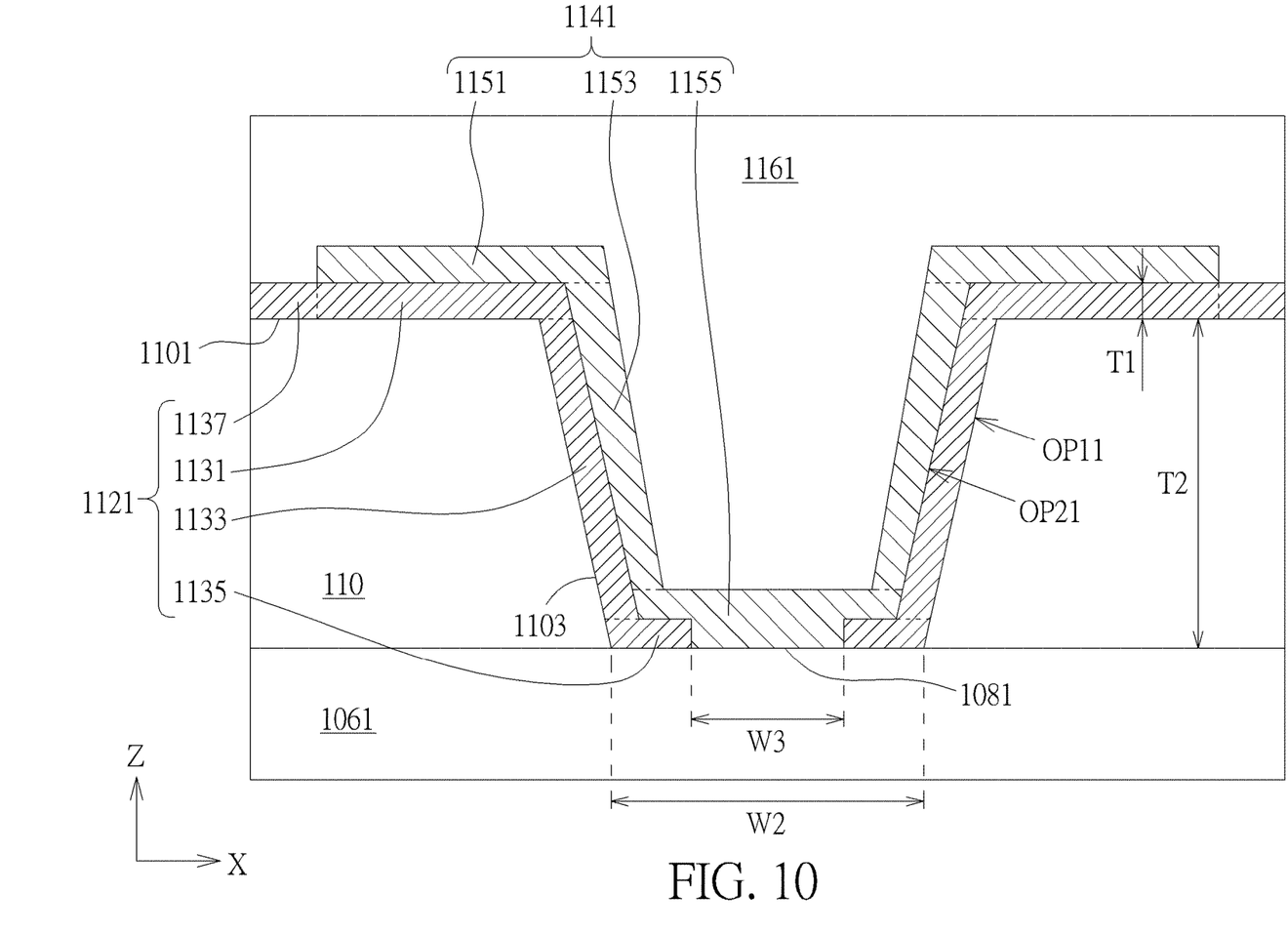
FIG. 10 is a partially enlarged schematic cross-sectional diagram of an electronic device according to a third embodiment of the present disclosure.

Please refer to FIG. 10, which is a partially enlarged schematic cross-sectional diagram of an electronic device according to a third embodiment of the present disclosure. The difference between this embodiment and the second embodiment (as shown in FIG. 9) is that the insulating layer 1121 may further include a portion 1137, and the portion 1131 may be connected with the portion 1137 and the portion 1133. One end of the portion 1131 may be connected to the portion 1137, and another end of the portion 1131 may be connected to the portion 1133. The portion 1137 and the portion 1131 may be disposed on the upper surface 1101 of the insulating layer 110. In addition, the portion 1151 of the seed layer 1141 may be disposed on the portion 1131 of the insulating layer 1121, and the portion 1151 of the seed layer 1141 may cover the portion 1131 of the insulating layer 1121 but not cover the portion 1137 of the insulating layer 1121.

Figure 12:
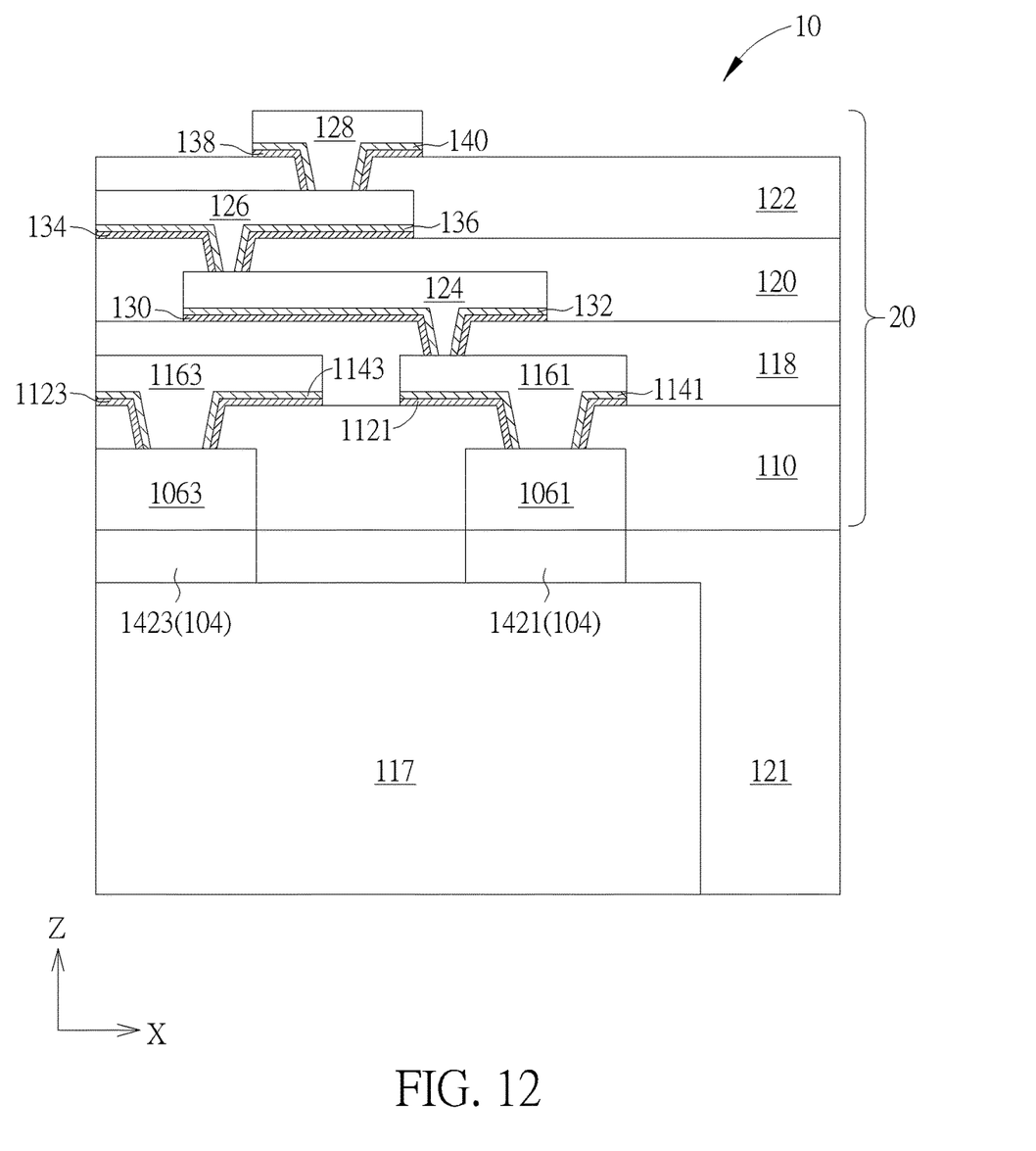
FIG. 12 is a schematic cross-sectional diagram of an electronic device according to a fourth embodiment of the present disclosure.

Please refer to FIG. 12, which is a cross-sectional schematic diagram of an electronic device according to a fourth embodiment of the present disclosure. In some embodiments (as shown in FIG. 12), the electronic device 10 may be a chip first package structure. As shown in FIG. 12, the stacked structure 20 of the metal layers and the insulating layers may be disposed on a molding layer 121 and a chip 117, or the molding layer 121 and the chip 117 may be formed on the stacked structure 20 of the metal layers and the insulating layers, but not limited thereto. The chip 117 may be disposed in the molding layer 121, and the stacked structure 20 may be bonded to contacts on the chip 117 through the metal layer 1421 and the metal layer 1423, but not limited thereto. In some embodiments of the chip first package structure (as shown in FIG. 12) and the manufacturing method thereof, the substrate 100 and the release layer 102 in FIG. 1 may not be included, but not limited thereto.

In addition, in some embodiments of the chip first package structure and the manufacturing method thereof, the substrate 100 and the release layer 102 in FIG. 1 may be included, but not limited thereto. For example, the substrate 100 and the release layer 102 may be disposed under the molding layer 121 and the chip 117, or the release layer 102 may be disposed between the chip 117 and the substrate 100, and between the molding layer 121 and the substrate 100, but not limited thereto.

In summary, in the electronic devices and the manufacturing methods thereof of the present disclosure, a second insulating layer may be formed between a first insulating layer and a seed layer, where the second insulating layer includes a silane coupling agent that enhances the adhesion between the seed layer (or the metal layer) and the first insulating layer, and a plasma surface treatment and a vacuum equipment may not be required. In this way, the reliability of the electronic devices can be improved, and the cost thereof can also be saved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
a stacked structure comprising:
  a first metal layer;
  a first insulating layer, disposed on the first metal layer, wherein the first insulating layer comprises a first opening exposing an upper surface of the first metal layer;
  a second metal layer, disposed on the first insulating layer;
  a second insulating layer, disposed between the second metal layer and the first insulating layer, wherein a material of the second insulating layer comprises a silane coupling agent, and the second insulating layer comprises a second opening disposed in the first opening; and
  a seed layer disposed between the second metal layer and the second insulating layer, wherein the seed layer extends into the second opening to be in direct contact with the upper surface of the first metal layer, and the second insulating layer is disposed between the seed layer and the first insulating layer; and
a chip bonded to the stacked structure through a bonding pad,
wherein the second metal layer is electrically connected to the first metal layer through the first opening and the second opening.

2. The electronic device according to claim 1, wherein a thickness of the second insulating layer is different from a thickness of the first insulating layer.

3. The electronic device according to claim 1, wherein a ratio of a width of the second opening of the second insulating layer to a width of the first opening of the first insulating layer is greater than or equal to 0.5 and less than 1.

4. The electronic device according to claim 1, wherein at least a portion of the second insulating layer is overlapped with the first metal layer within the first opening.

5. The electronic device according to claim 1, further comprising a redistribution layer, wherein the redistribution layer comprises the first metal layer, the first insulating layer, the second insulating layer and the second metal layer.

* * * * *